(12) United States Patent
Kitae et al.

(10) Patent No.: US 7,611,040 B2
(45) Date of Patent: Nov. 3, 2009

(54) METHOD FOR FORMING SOLDER BUMP AND METHOD FOR MOUNTING SEMICONDUCTOR DEVICE USING A SOLDER POWDER RESIN COMPOSITION

(75) Inventors: Takashi Kitae, Osaka (JP); Seiichi Nakatani, Osaka (JP); Toshiyuki Kojima, Kyoto (JP); Shingo Komatsu, Osaka (JP); Yoshihisa Yamashita, Kyoto (JP)

(73) Assignee: Panasonic Corporation, Osaka (JP)

( * ) Notice: Subject to any disclaimer, the term of this patent is extended or adjusted under 35 U.S.C. 154(b) by 273 days.

(21) Appl. No.: 11/579,505

(22) PCT Filed: Apr. 25, 2006

(86) PCT No.: PCT/JP2006/308616

§ 371 (c)(1),
(2), (4) Date: Nov. 3, 2006

(87) PCT Pub. No.: WO2006/126361

PCT Pub. Date: Nov. 30, 2006

(65) Prior Publication Data

US 2008/0197173 A1    Aug. 21, 2008

(30) Foreign Application Priority Data

May 24, 2005    (JP)    ............................. 2005-150374

(51) Int. Cl.
*B23K 31/02* (2006.01)
*H01L 21/44* (2006.01)
(52) U.S. Cl. .................. 228/180.22; 438/613
(58) Field of Classification Search .............. 249/114.1, 249/115; 264/272.15; 429/96.1, 282; 438/613–616; 228/178–180.22, 248.1, 208, 254, 245
See application file for complete search history.

(56) References Cited

U.S. PATENT DOCUMENTS 5,130,779 A * 7/1992 Agarwala et al. ........... 257/772

(Continued)

FOREIGN PATENT DOCUMENTS

JP        5-13496        1/1993

(Continued)

OTHER PUBLICATIONS

Masahiro Rito et al. "Assembly Process by Electrically Conductive Adhesive Using Low Melting Point Fillers" 9th Symposium on "Microjoining and Assembly Technology in Electronics" Feb. 6-7, 2003, Yokohama.

(Continued)

*Primary Examiner*—Jessica L. Ward
*Assistant Examiner*—Carlos Gamino
(74) *Attorney, Agent, or Firm*—McDermott Will & Emery LLP

(57) ABSTRACT

A method for forming solder bumps for realizing high density mounting and a highly reliable method for mounting a semiconductor device is provided. A flat plate having a plurality of projections or recesses thereon is prepared; the flat plate is aligned to oppose an electronic component and a resin composition including a solder powder is supplied to a gap between the flat plate and the electronic component; the resin composition is annealed to melt the solder powder included in the resin composition for growing the solder powder up to the level of the surface of the flat plate by allowing the melted solder powder to self-assemble on terminals, so as to form solder bumps on the terminals; and the flat plate is removed after cooling and solidifying the solder bumps. Thus, the solder bumps having pits corresponding to the projections or having protrusions corresponding to the recesses are formed.

12 Claims, 6 Drawing Sheets

U.S. PATENT DOCUMENTS

| | | | | |
|---|---|---|---|---|
| 5,286,417 | A * | 2/1994 | Mahmoud et al. | 252/519.33 |
| 5,762,259 | A * | 6/1998 | Hubacher et al. | 228/180.22 |
| 5,767,580 | A * | 6/1998 | Rostoker | 257/737 |
| 5,872,051 | A * | 2/1999 | Fallon et al. | 438/616 |
| 5,958,590 | A * | 9/1999 | Kang et al. | 428/403 |
| 5,961,032 | A * | 10/1999 | Covell et al. | 228/254 |
| 6,025,258 | A * | 2/2000 | Ochiai et al. | 438/613 |
| 6,225,206 | B1 * | 5/2001 | Jimarez et al. | 438/616 |
| 6,365,842 | B1 * | 4/2002 | Jiang | 174/261 |
| 6,450,850 | B1 * | 9/2002 | Nunomura | 445/24 |
| 6,609,652 | B2 * | 8/2003 | MacKay et al. | 228/254 |
| 6,612,027 | B2 * | 9/2003 | Akram | 29/843 |
| 6,674,647 | B2 * | 1/2004 | Pierson et al. | 361/760 |
| 6,897,142 | B2 * | 5/2005 | Fujimori et al. | 438/615 |
| 7,015,132 | B2 * | 3/2006 | Lahiri et al. | 438/614 |
| 7,273,806 | B2 * | 9/2007 | Groves et al. | 438/615 |
| 7,332,423 | B2 * | 2/2008 | Starkston et al. | 438/612 |
| 2006/0108402 | A1 * | 5/2006 | Crisp et al. | 228/248.1 |
| 2007/0181218 | A1 * | 8/2007 | Sakamoto et al. | 148/25 |

FOREIGN PATENT DOCUMENTS

| | | |
|---|---|---|
| JP | 6-310565 | 11/1994 |
| JP | 11-17050 | 1/1999 |
| JP | 11243106 A * | 9/1999 |
| JP | 2000-100868 | 4/2000 |
| JP | 2002-093842 | 3/2002 |
| JP | 2004-158701 | 6/2004 |
| JP | 2004-260131 | 9/2004 |

OTHER PUBLICATIONS

Masahiro Yasuda et al., "Self-Organized Joining Assembly Process by Electrically Conductive Adhesive Using Low Melting Point Fillers", 10th Symposium on "Microjoining and Assembly Technology in Electronics" Feb. 6-7, 2003 Yokohama, p. 115-120.

Kiyokazu Yasuda et al. "Self-Organized Packaging using Polymer Containing Low-Melting-Point-Metal filler-Process Simulation of Viscous Multi Phase Flow Fluid-" 11th Symposium on "Microjoining and Assembly Technology in Electronics" Feb. 3-4, 2005, Yokohama.

Takayuki Yamada et al. "Self-organized Packaging by Polymer Containing Low Melting Point Metal-Experimental Verification of Process Rule Factors of Self-organization-" 11th Symposium on Microjoining and Assembly Technology in Electronics, Feb. 3-4, 2005, Yokohama.

* cited by examiner

METHOD FOR FORMING SOLDER BUMP AND METHOD FOR MOUNTING SEMICONDUCTOR DEVICE USING A SOLDER POWDER RESIN COMPOSITION

RELATED APPLICATIONS

This application is the U.S. National Phase under 35 U.S.C. 0371 of International Application No. PCT/JP2006/308616 filed on Apr. 25, 2006, which in turn claims the benefit of Japanese Application No. 2005-150374 filed on May 24, 2005, the disclosures of which Applications are incorporated by reference herein.

TECHNICAL FIELD

The present invention relates to a method for forming solder bumps for use in mounting a semiconductor device on a wiring board and a method for mounting a semiconductor device having solder bumps formed by the solder bump formation method on a wiring board.

BACKGROUND ART

Recently, in accordance with downsizing and improved performance of electronic equipment, signal processing has been developed for digitalization and higher frequencies. Also with respect to semiconductor devices working as core components in such electronic equipment, it is desired to increase the number of connection terminals and reduce the pitch between the connection terminals in accordance with increase of the circuit scale. Furthermore, it has become significant to reduce wiring delay between a semiconductor device and a wiring board and to prevent noise. Therefore, as a connection method between a semiconductor device and a wiring board, a flip-chip mounting method is employed instead of a conventional mounting method typified by wire bonding.

In the flip-chip mounting method, solder bump connection in which solder bumps, that is, projection electrodes, are formed on electrode terminals of a semiconductor device and the semiconductor device is connected as a whole to connection terminals formed on a wiring board through the solder bumps is widely employed. In a conventional solder bump formation method, however, bumps are formed merely in a hemispherical shape because solder should be melted once. Therefore, it is difficult to employ the conventional method for reducing the pitch between and increasing the number of connection terminals.

On the other hand, in another conventionally employed method, a bump made of a metal such as gold (Au) is formed on an electrode terminal of a semiconductor device and the bump is connected to a connection terminal of a wiring board with a conducting adhesive or an anisotropic conducting adhesive. This method, however, is not sufficient for reducing the pitch between and increasing the number of connection terminals in the same manner as the conventional solder bump connection.

Moreover, a recent electronic circuit is constructed mainly from semiconductor devices. Accordingly, it is desired to inexpensively mount semiconductor devices at a high density on a wiring board for realizing low cost, compactness and high performance of electronic equipment.

By such a desire, Patent Document 1 describes a technique in which a bump provided on an electrode terminal is formed in a pyramid shape having a base with a length of, for example, 10 through 60 µm and having a sharp tip. Since the bump has a sharp tip, a high mounting density can be attained without causing a connection failure in connection between a wiring board and a semiconductor device.

Also, Patent Document 2 describes a technique in which a connection terminal of a wiring board is formed in a projection shape and a recess capable of fitting a projection of the wiring board is formed on an electrode terminal of a semiconductor device so as to mount the semiconductor device on the wiring board with the projection of the wiring board fit in the recess of the semiconductor device. The connection between the terminals is carried by reflowing a metal with a low melting point provided in the recess. Thus, it is possible to realize high density mounting capable of coping with a fine pitch between electrode terminals and having high connection strength.

Furthermore, as a similar technique, Patent Document 3 describes a technique in which a recess in a shape corresponding to the shape of a projection electrode of a semiconductor device is provided on a connection terminal of a wiring board so as to mount the semiconductor device on the wiring board by fitting the projection electrode of the semiconductor device in the recess of the wiring board. Thus, it is possible to realize highly reliably high density mounting having high connection strength between a wiring board and a semiconductor device.

Moreover, Patent Document 4 describes a technique in which an insulating resin layer having an opening on a connection terminal is formed on a wiring board so as to mount a semiconductor device on the wiring board by fitting a projection electrode of the semiconductor device in the opening of the wiring board. The connection between the terminals is carried out by reflowing solder filled in the opening. Thus, it is possible to realize highly reliable high density mounting free from a connection failure.

Patent Document 1: Japanese Laid-Open Patent Publication No. 2002-93842

Patent Document 2: Japanese Laid-Open Patent Publication No. 5-13496

Patent Document 3: Japanese Laid-Open Patent Publication No. 11-17050

Patent Document 4: Japanese Laid-Open Patent Publication No. 2000-100868

DISCLOSURE OF THE INVENTION

Problems to be Solved by the Invention

In the technique described in Patent Document 1, the shape of the bump is obtained by forming a sharp tin film through formation of the tin film in a hole provided on a substrate and transferring and connecting this tin film onto a connection terminal of the semiconductor device. Therefore, the fabrication process is complicated and it is difficult to form the bump at low cost.

Furthermore, the techniques described in Patent Documents 2 through 4 are the same in forming a recess on a terminal of one of a wiring board and a semiconductor device and fitting a projection formed on a terminal of the other of the wiring board and the semiconductor device in the recess for mounting the semiconductor device on the wiring board. In any of these techniques, the procedure for forming the recess is complicated and hence it is difficult to form the bump at low cost.

Specifically, in Patent Document 2, the recess formed on the connection terminal of the semiconductor device is formed by plating a gold projection on the connection terminal in the shape of a ring. In this case, it is also difficult to form the recess in a shape corresponding to a projection electrode of the wiring board.

Also, in Patent Document 3, the recess formed on the electrode terminal of the wiring board is obtained by forming a recess by pressing the projection electrode of the semiconductor device onto a conducting paste supplied onto the wiring board by screen printing and baking the conducting paste. In this case, it is necessary to form the conducting paste in a thickness equivalent to the height of the projection electrode, and hence, it is also difficult to process the conducting paste (electrode terminal).

Also, in Patent Document 4, the recess formed on the electrode terminal of the wiring board is obtained by providing an opening in the insulating resin layer formed on the wiring board in a position above the electrode terminal. In this case, it is necessary to form the insulating resin layer in a thickness equivalent to the height of the projection electrode of the semiconductor device, and hence, it is difficult to process the insulating resin layer. In addition, it is also difficult to form the recess in a shape corresponding to the projection electrode of the semiconductor device.

The present invention was devised in consideration of these conventional disadvantages, and a principal object thereof is providing a method for forming solder bumps for realizing high density mounting as well as a highly reliable method for mounting a semiconductor device.

Means for Solving the Problems

The method for forming solder bumps of this invention is a method for forming solder bumps on terminals of an electronic component having a plurality of terminals, includes the steps of preparing a flat plate having a plurality of projections or recesses on a surface thereof; supplying a resin composition including a solder powder to a gap between the flat plate and the electronic component with the flat plate aligned to oppose the electronic component; forming solder bumps on the terminals by melting the solder powder included in the resin composition through annealing of the resin composition and by allowing the melted solder powder to self-assemble on the terminals for growing the melted solder powder up to a level of a surface of the flat plate; and removing the flat plate after cooling and solidifying the solder bumps, and the solder bumps have pits corresponding to the projections or projections corresponding to the recesses.

In this method, the melted solder powder included in the resin composition is made to self-assemble on the terminals of the electronic component, so as to easily form the solder bumps each having a projection or a pit. Also, the height of the solder bumps to be formed can be controlled by using the flat plate, and hence, the solder bumps with a uniform height can be formed. Therefore, when solder bumps are formed by this method on terminals of a semiconductor device and/or a wiring board, it is possible to perform high density semiconductor mounting with high reliability.

In a preferred embodiment, the step of supplying a resin composition comprises the steps of supplying the resin composition onto the electronic component; and allowing the flat plate to come into contact with a surface of the resin composition while opposing the electronic component.

In the step of allowing the flat plate to come into contact with the surface of the resin composition, the flat plate is preferably allowed to come into contact with the resin composition with the projections brought into contact with the terminals. Thus, the gap between the terminals and the flat plate can be kept constant by using the projections from the self-assemble of the solder powder to the solidification of the solder bumps, and therefore, the solder bumps can be formed in a more uniform height.

In a preferred embodiment, the electronic component is a wiring board or a semiconductor device.

A metal film with wettability with solder is preferably formed on the projections or recesses. Thus, when the melted solder powder self-assembles on the terminals, the solder powder in contact with the projections or the recesses is grown while fixed on the metal film with high wettability, and hence, the solder bumps can be formed in a uniform shape.

Furthermore, a mold releasing layer having a mold releasing property with the projections or recesses is preferably formed on the projections or recesses. Thus, the flat plate can be easily removed after solidifying the solder bumps formed on the terminals.

Furthermore, the method preferably further includes, after the step of removing the flat plate, a step of removing the resin composition.

In a preferred embodiment, in the step of forming solder bumps, the resin composition is annealed for allowing the resin composition to self-assemble on the terminals, the resin composition is further annealed to melt the solder powder included in the resin composition, and the solder powder is grown up to the level of the surface of the flat plate by allowing the melted solder powder to self-assemble on the terminals, whereby forming solder bumps on the terminals.

The method for mounting a semiconductor device of this invention is a method for mounting a semiconductor device on a wiring board and includes the steps of forming solder bumps having pits on terminals of one of the semiconductor device and the wiring board; forming solder bumps having projections on terminals of the other of the semiconductor device and the wiring board; and mutually fitting and connecting the solder bumps formed on the terminals of the semiconductor device and the solder bumps formed on the terminals of the wiring board, and at least the solder bumps having pits or the solder bumps having projections are formed by the method for forming solder bumps of the invention.

In this method, when the solder bumps having the projections and the pits are mutually fit and connected, the semiconductor device can be easily and definitely mounted on the wiring board. Also, since the solder bumps can be fit and connected without melting them, the semiconductor device can be mounted at a low temperature.

In a preferred embodiment, the step of mutually fitting and connecting the solder bumps includes a step of annealing for melting at least either of the solder bumps of the semiconductor device or the solder bumps of the wiring board mutually fit. Thus, the solder bumps can be more firmly connected, and hence, it is possible to perform semiconductor mounting with high reliability. In this case, the solder bumps of the semiconductor device are preferably made of a different solder material from the solder bumps of the wiring board.

Effect of the Invention

According to the present invention, solder bumps each having a projection or a pit can be easily formed by melting a solder powder included in a resin composition and allowing the melted solder powder to self-assemble on terminals of a plate. Also, since the height of the solder bumps to be formed can be controlled by using the flat plate, the solder bumps in a uniform height can be formed. Therefore, when the solder bumps of this invention are formed on terminals of a semiconductor device and/or a wiring board, it is possible to perform high density semiconductor mounting with high reliability.

Furthermore, a semiconductor device can be easily and definitely mounted on a wiring board by mutually fitting and connecting solder bumps having projections and/or pits formed according to the invention. Therefore, it is possible to perform semiconductor mounting with high reliability.

Figure 1A:
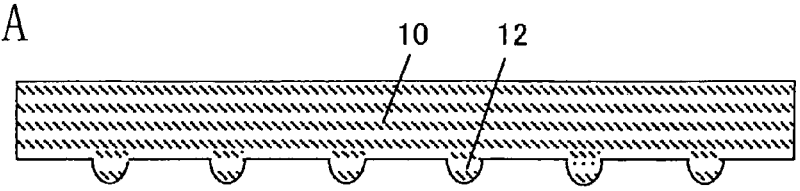
FIGS. 1A through 1E are cross-sectional views for schematically showing procedures in a method for forming solder bumps according to Embodiment 1 of the invention.

DESCRIPTION OF REFERENCE NUMERALS 10, 30, 50 flatplate
12, 52 projection
14, 54 wiring board
16, 36, 56, 68 terminal
18, 19, 58 resin composition
20, 21, 60 resin
22, 23, 62 solder powder
24, 38, 64 solder bump
24a, 64a pit
30 flat plate
32 recess
34, 66 semiconductor device
38a projection
40 solder bump-formed wiring board
42 solder bump-formed semiconductor device
44 integrated bump
46 underfill resin
70 bump
72 mold releasing layer
74 metal film

BEST MODE FOR CARRYING OUT THE INVENTION

Now, preferred embodiments of the invention will be described with reference to the accompanying drawings. In the drawings referred to below, like reference numerals are used to refer to like elements having substantially the same functions for simplifying the description. The present invention is hot limited to the embodiments described below.

Embodiment 1

FIG. 1 shows cross-sectional views for schematically showing procedures in a method for forming solder bumps according to Embodiment 1 of the invention. In this embodiment, a case where a wiring board is used as an electronic component will be described.

As shown in FIG. 1A, projections 12 are formed on one face of a flat plate 10 in positions corresponding to terminals 16 for forming bumps of a wiring board 14. Such projections 12 with a constant height can be formed at a given pitch by, for example, forming a given pattern on the flat plate 10 by photolithography process and removing an unwanted portion of the flat plate with this pattern used as a mask by etching, sandblasting or the like. Alternatively, the projections 12 can be formed by a printing method. As the flat plate 10, for example, a glass plate, a ceramic plate, a silicon plate or a plastic plate with heat resistance can be used.

Furthermore, the wiring board 14 may be a multi-layered board or a double-sided wiring board. A substrate of the wiring board is not particularly specified as far as it is made of a material resistive to the melting temperature of solder, and may be a glass epoxy substrate, a resin substrate such as a polyimide substrate, a ceramic substrate, a glass substrate or a silicon substrate.

It is noted that conducting interconnects not shown are formed on the face of the wiring board 14 where the terminals 16 are formed. In the case where a resin composition 18 described later is formed on the conducting interconnects, the conducting interconnects are preferably previously covered with a resin film of a material not wettable with solder, such as plating resist, or an inorganic insulating film. Furthermore, in order to accurately define a region of the terminal 16 where the solder is grown as described later, a plating resist or the like is preferably formed around the terminal 16.

Figure 1B:
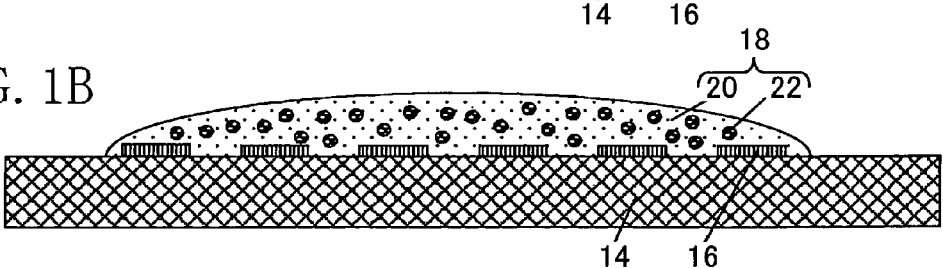

Next, as shown in FIG. 1B, a given amount of the resin composition 18 is applied on a portion of the wiring board 14 where the terminals 16 are formed. Specifically, the amount is set so that when the flat plate 10 is brought into contact with the resin composition 18, the resin composition 18 can be spread to cover all the terminals 16 of the wiring board 14 and to fill a given gap provided between the flat plate 10 and the wiring board 14. The resin composition 18 used in this case is in the form of paste and has comparatively large viscosity. The resin composition 18 is made of a resin 20 including a solder powder 22. Alternatively, the form of the resin composition 18 is not limited to the paste but may be a sheet at room temperature.

It is noted that before applying the resin composition 18, the surface of the wiring board 14, and the surface of the terminal 16 in particular, is preferably cleaned with an organic solvent, such as acetone or alcohol, or a cleaning liquid.

Figure 1C:
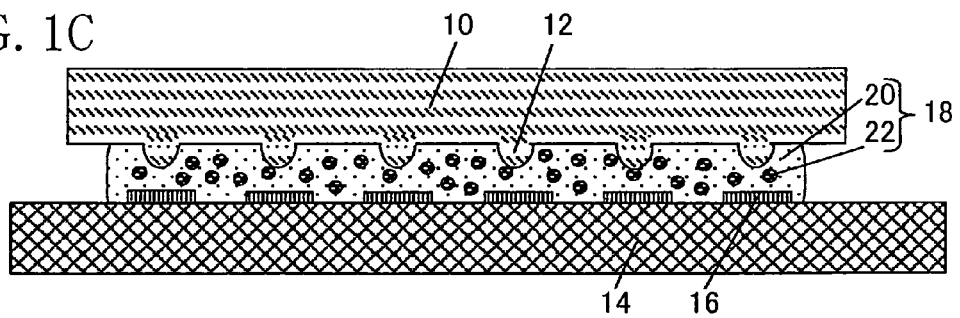

Next, as shown in FIG. 1C, the wiring board 14 and the flat plate 10 are aligned so that the terminals 16 of the wiring board 14 can oppose the projections 12 of the flat plate 10, and the flat plate 10 is brought into contact with the resin composition 18. Through this contact, the resin composition 18 is uniformly spread between the wiring board 14 and the flat plate 10 and keeps a given thickness, and a substantially enclosed space is thus formed. Even through this contact, the projections 12 of the flat plate 10 are not in contact with the terminals 16 of the wiring board 14. In other words, the height of the projections 12 is smaller than the thickness of the resin composition 18 attained when the flat plate 10 is in contact with the resin composition 18.

At this point, in order to keep a given gap between the flat plate 10 and the wiring board 14, the wiring board 14 and the flat plate 10 are preferably mechanically fixed. Furthermore, in this case, the parallelism between the flat plate 10 and the wiring board 14 is more preferably kept.

As a method for supplying the resin composition 18 into the gap between the flat plate 10 and the wiring board 14, after the flat plate 10 and the wiring board 14 are previously aligned to oppose each other, the resin composition 18 may be injected into the gap between the flat plate 10 and the wiring board 14 with, for example, a nozzle or the like.

Figure 1D:
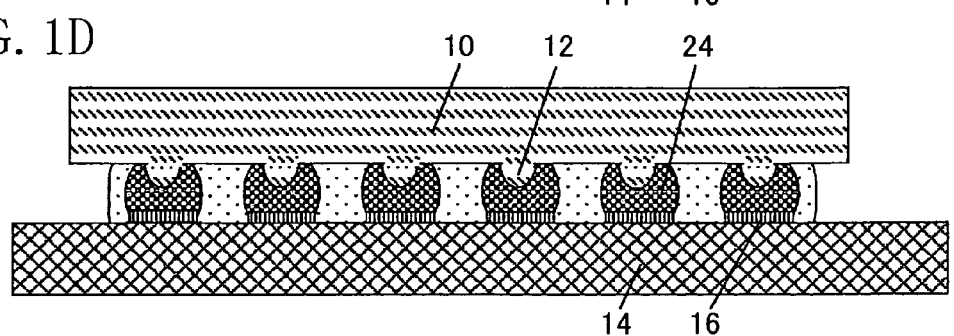

Next, as shown in FIG. 1D, at least the resin composition 18 is annealed at a temperature at which the solder powder 22 is melted. It is noted that the resin composition 18 may be annealed with a heater through the wiring board 14 or through the flat plate 10. Alternatively, the whole may be placed in a furnace to be wholly annealed. Alternatively, microwaves may be used for annealing merely the resin composition 18 and its vicinity.

Through this annealing, the viscosity of the resin 20 included in the resin composition 18 is lowered and its flowability is increased. The melted solder powder 22 moves within the resin 20 and self-assembles on the terminals 16 with high wettability. When the solder is gradually grown on the terminals 16 in this manner, the solder is ultimately grown up to the level of the surface of the flat plate 10 so as to surround the projections 12, resulting in forming solder bumps 24.

At this point, the resin composition 18 may include an additive that is boiled or decomposed through this annealing for releasing a gas. Since the resin composition 18 including the released gas is filled within the space closed between the flat plate 10 and the wiring board 14, the resin composition 18 is moved (namely, convected) by the gas, and hence, the solder powder 22 is forcedly moved. Ultimately, the gas is released to the outside through an outer circumferential gap between the flat plate 10 and the wiring board 14.

It is noted that the additive (hereinafter referred to as the convection additive) may not be boiled or decomposed always after the melting temperature of the solder powder 22 is attained. It may be boiled or decomposed for releasing the gas at a temperature lower than the melting temperature of the solder powder 22.

Since the gas generated within the resin composition 18 reaches the outer circumference while convecting within the resin composition 18 and then is released to the outside, the solder powder 22 also moves around within the resin composition 18 owing to the energy of the convection caused by the gas. Owing to this effect, the solder powder 22 self-assembles on the terminals 16 so as to form the bumps in a uniform shape. Thus, the solder is grown on the terminals 16 ultimately up to the level of the surface of the flat plate 10 so as to surround the projections 12, resulting in forming the solder bumps 24.

Figure 1E:
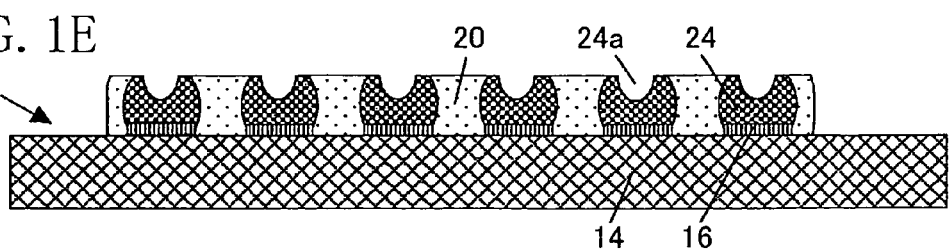

Next, as shown in FIG. 1E, after forming the solder bumps 24 (and after the gas release caused by the convection additive is ended when the resin composition 18 includes the convection additive), the resin 20 is cured. After curing the resin 20, the annealing is stopped and the solder bumps 24 are cooled to be solidified. After completing the solidification, when the flat plate 10 is removed, the solder bump 24 having a pit 24a at the center is formed on each terminal 16 of the wiring board 14.

In this manner, a solder bump-formed wiring board 40 in which the solder bumps 24 each having the pit 24a at the center are formed on the respective terminals 16 of the wiring board 14 is obtained.

These solder bumps 24 are defined in their height by the gap between the flat plate 10 and the wiring board 14, and hence, their height can be made very uniform. Also, their diameter along the lateral direction is substantially defined by the shape of the terminal 16. Since the shape of the terminal 16 can be highly precisely obtained by the photolithography process, the diameter along the lateral direction can be also made very uniform. Moreover, the shape of the pit 24a is defined by the projection 12, and when the projection 12 is formed by employing the photolithography process, the pits 24a can be similarly formed in a uniform shape.

Accordingly, the solder bumps 24 formed in this embodiment can be made very uniform all in the height, the diameter along the lateral direction and the bit 24a. Therefore, when the solder bump-formed wiring board is used, a semiconductor device or the like can be mounted on a wiring board with high yield.

It is noted that a semiconductor device, a passive component or the like may be mounted on a face of the wiring board 14 excluding the portion where the solder bumps are formed.

Embodiment 2

FIG. 2 shows cross-sectional views for schematically showing procedures in a method for forming solder bumps according to Embodiment 2 of the invention. In this embodiment, a case where a semiconductor device 34 is used as an electronic component will be described. In procedures commonly performed in Embodiment 1, this embodiment is not limited to the description below but any of various conditions, materials and the like described in Embodiment 1 can be appropriately employed.

Figure 2A:
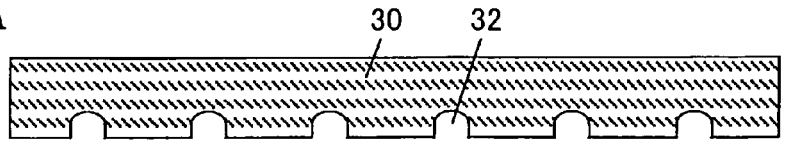
FIGS. 2A through 2E are cross-sectional views for schematically showing procedures in a method for forming solder bumps according to Embodiment 2 of the invention.

As shown in FIG. 2A, recesses 32 are formed on one face of a flat plate 30 in positions corresponding to terminals 36 for forming bumps of the semiconductor device 34. Such recesses 32 with a given depth can be formed at a given pitch by, for example, forming a given pattern on the flat plate 30 by the photolithography process and performing the etching, the sandblasting or the like with this pattern used as a mask. As the flat plate 30, for example, a glass plate, a ceramic plate, a silicon plate or a plastic plate with heat resistance can be used.

Figure 2B:
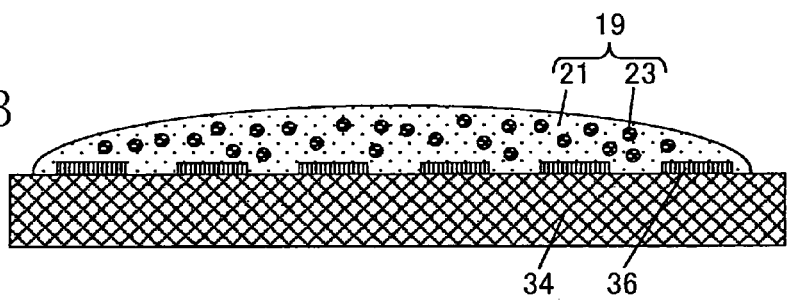

Next, as shown in FIG. 2B, a given amount of a resin composition 19 is applied on a portion of the semiconductor device 34 where the terminals 36 are formed. Specifically, the amount is set so that when the flat plate 30 is brought into contact with the resin composition, the resin composition 19 can be spread to cover all the terminals 36 of the semiconductor device 34 and to fill a given gap provided between the flat plate 30 and the semiconductor device 34. The resin composition 19 used in this case is in the form of paste and has comparatively large viscosity. The resin composition 19 includes, as principal components, a solder powder 23, a convection additive (not shown) and a resin 21. Alternatively, the form of the resin composition 19 is not limited to the paste but may be a sheet at room temperature.

It is noted that before applying the resin composition 19, the surface of the semiconductor device 34, and the surface of the terminal 36 in particular, is preferably cleaned with an organic solvent, such as acetone or alcohol, or a cleaning liquid.

Figure 2C:
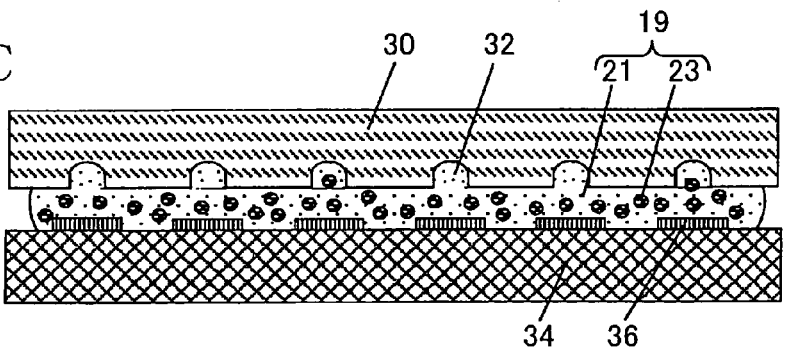

Next, as shown in FIG. 2C, the semiconductor device 34 and the flat plate 30 are aligned so that the terminals 36 of the semiconductor device 34 can oppose the recesses 32 of the flat plate 30, and the flat plate 30 is brought into contact with the resin composition 19. Through this contact, the resin composition 19 is uniformly spread between the semiconductor device 34 and the flat plate 30 and keeps a given thickness, and a substantially enclosed space is thus formed.

At this point, in order to keep a given gap between the flat plate 30 and the semiconductor device 34, the semiconductor device 34 and the flat plate 30 are preferably mechanically fixed. Furthermore, in this case, the parallelism between the flat plate 30 and the semiconductor device 34 is more preferably kept.

Figure 2D:
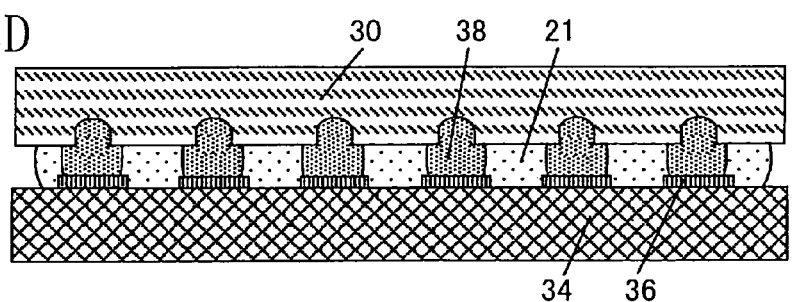

Next, as shown in FIG. 2D, at least the resin composition 19 is annealed to a temperature at which the solder powder 23 is melted. It is noted that the resin composition 19 may be annealed with a heater through the semiconductor device 34 or through the flat plate 30. Alternatively, the whole may be placed in a furnace to be wholly annealed. Alternatively, microwaves may be used for annealing merely the resin composition 19 and its vicinity.

Through this annealing, the viscosity of the resin 21 included in the resin composition 19 is lowered and its flowability is increased. Simultaneously, the convection additive is boiled or decomposed through this annealing so as to release a gas. Since the resin composition 19 including the released gas is filled within the space closed between the flat plate 30 and the semiconductor device 34 at this point, the resin composition 19 is moved (namely, convected) by the gas, and hence, the solder powder 23 is forcedly moved. Ultimately, the gas is released to the outside through an outer circumferential gap between the flat plate 30 and the semiconductor device 34.

It is noted that the convection additive may not be boiled or decomposed always after the melting temperature of the solder powder 23 is attained. It may be boiled or decomposed for releasing the gas at a temperature lower than the melting temperature of the solder powder 23.

Since the gas generated within the resin composition 19 reaches the outer circumference while convecting within the resin composition 19 and then is released to the outside, the solder powder 23 also moves around within the resin composition 19 owing to the energy of the convection caused by the gas. Owing to this effect, the solder powder 23 self-assembles on the terminals 36 so as to form the bumps in a uniform shape. Thus, the solder is grown on each terminal 36 so as to ultimately grown up to the level of the surface of the flat plate 30, resulting in forming a solder bump 38 in a two-level shape.

Figure 2E:
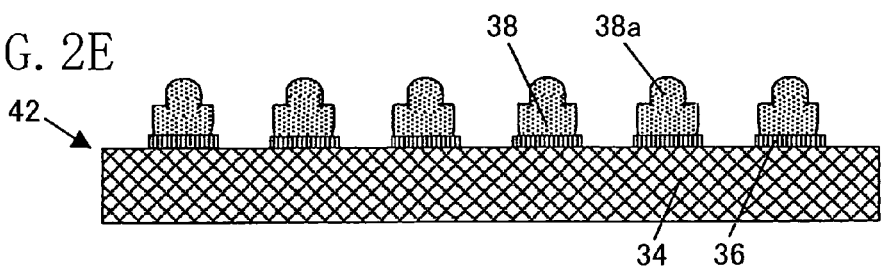

Next, as shown in FIG. 2E, after forming the solder bumps 38, the annealing is stopped and the solder bumps 38 are cooled to be solidified. After completing the solidification, when the flat plate 30 is removed, the solder bump 38 having a projection 38*a* at the center is formed on each terminal 36 of the semiconductor device 34. Thereafter, the resin 21 is removed through the etching or the like, so as to obtain a solder bump-formed semiconductor device 42 in which the solder bumps 38 each in a two-level shape are formed as shown in FIG. 2E.

These solder bumps 38 are defined in their height by the gap between the flat plate 30 and the semiconductor device 34, and hence, their height can be made very uniform. Also, the diameter along the lateral direction is substantially defined by the shape of the terminal 36. Since the shape of the terminal 36 can be highly precisely obtained by the photolithography process, the diameter along the lateral direction can be also made very uniform. Moreover, the shape of the projection 38*a* is defined by the recess 32. When the recesses 32 are formed by employing the photolithography process, the projections 38*a* can be similarly formed in a uniform shape. Accordingly, the solder bumps 38 formed in this embodiment can be made very uniform all in the height, the diameter along the lateral direction and the projection 38*a*.

In each of Embodiments 1 and 2, as the annealing temperature for the wiring board 14 or the semiconductor device 34, an optimal temperature profile is preferably set in accordance with the components of the resin composition 18 or 19. For example, in the case where tin-silver-copper (Sn—Ag—Cu) alloy solder is used as the solder powder 22 or 23 and isopropyl alcohol is used as the convection additive, the terminal temperature is preferably set within a range of 230° C. through 240° C.

Furthermore, in the case where the resin 21 is thermally cured after completing the connection, when, for example, an epoxy resin is used, the resin is preferably annealed in a temperature range of 100° C. through 250° C.

It is noted that the solder powder 22 or 23 is not limited to the Sn—Ag—Cu alloy described above. For example, tin-zinc (Sn—Zn)-based alloy solder, tin-bismuth (Sn—Bi)-based alloy solder, copper-silver (Cu—Ag)-based alloy solder, tin (Sn) solder, indium (In) solder, lead (Pb)-based solder or the like may be used.

Furthermore, the convection additive may be any additive that produces a gas through boiling or decomposition when annealed at the operation temperature, such as an aliphatic or aromatic solvent like alcohol or ether. It may be any material that releases a gas through boiling or decomposition when the wiring board 14 or the semiconductor device 34 corresponding to the electronic component is annealed at a temperature where the solder powder 22 or 23 is melted. It is noted that the resin composition 18 or 19 may include an oxide film removing agent such as rosin for removing an oxide film formed on the solder powder 22 or 23 and the terminals 16 or 36.

Moreover, in each of Embodiments 1 and 2, each terminal 16 or 36 on which the solder powder 22 or 23 self-assembles and grows is in a circular shape. The solder self-assembles and grows selectively on the circular portion. At least the surface of the terminal 16 or 36 is preferably covered with a metal material with high wettability with the solder, such as gold (Au). Alternatively, not only a metal material such as silver (Ag), copper (Cu), palladium (Pd), rhodium (Rh), platinum (Pt) or iridium (Ir) but also tin (Sn) or indium (In) included in the solder may be used. The shape of the terminal 16 or 36 is not particularly specified but can be, for example, in an elliptical shape, a square shape or a linear shape apart from the circular shape.

Furthermore, a region including the conducting interconnects and the like where the self-assemble and the growth of the solder is desired to be suppressed is preferably covered with a surface protecting film made of, for example, an inorganic material, such as an oxide film, a nitride film or an oxynitride film, or a surface protecting film made of a resin such as polyimide or epoxy.

Although the wiring board 14 or the semiconductor device 34 is annealed with the flat plate 10 or 30 brought into contact with the resin composition 18 or 19 and with a pressure applied in each of Embodiments 1 and 2, it is not always necessary to apply the pressure. The pressure is not particularly necessary as far as the wiring board 14 or the semiconductor device 34 has a shape and a weight sufficiently large for preventing it from being moved by the gas generated from the convection additive.

Moreover, although the solder powder 22 or 23 included in the resin composition is melted by annealing the resin composition 18 or 19 in each of Embodiments 1 and 2, the resin composition 18 or 19 may be allowed to self-assemble on the terminals 16 or 36 through surface tension by releasing the gas through the boiling or the decomposition of the additive included in the resin composition 18 or 19 caused through annealing at a temperature where the solder powder is not melted and by moving the resin composition 18 or 19 by using the released gas. In this case, the resin composition 18 or 19 having self-assembled is further annealed for melting the solder powder 22 or 23 included in the resin composition, so as to make the solder self-assemble on the terminals 16 or 36, and thus, the solder bumps 24 or 38 can be formed.

In the case where the solder bumps are formed by allowing the resin composition itself including the solder powder to self-assemble on the terminals, for example, when Embodiment 2 is practiced by using the flat plate 30 having the recesses 32, the flowing resin composition 19 can easily stay in the recesses 32, and hence, the resin composition 19 can be easily made to self-assemble on the terminals 36. Thereafter, the solder bumps 38 can be formed on the terminals 36 by melting the solder powder 23. In this case, the solder bumps 38 with a large height can be formed without increasing the gap between the flat plate 30 and the semiconductor device 34 (or the wiring board 14). It is noted that the solder bumps 38 having no projections 38*a* (namely, not in a two-level shape) can be formed with their height substantially kept by removing the flat plate 30 before solidifying the solder bumps 38.

Embodiment 3

FIG. 3 shows cross-sectional views for schematically showing procedures in a method for mounting a semiconductor device according to Embodiment 3 of the invention. In the method for mounting a semiconductor device of this embodiment, a solder bump-formed wiring board 40 formed by the method of Embodiment 1 and a solder bump-formed semiconductor device 42 formed by the method of Embodiment 2 are used for the mounting.

Figure 3A:
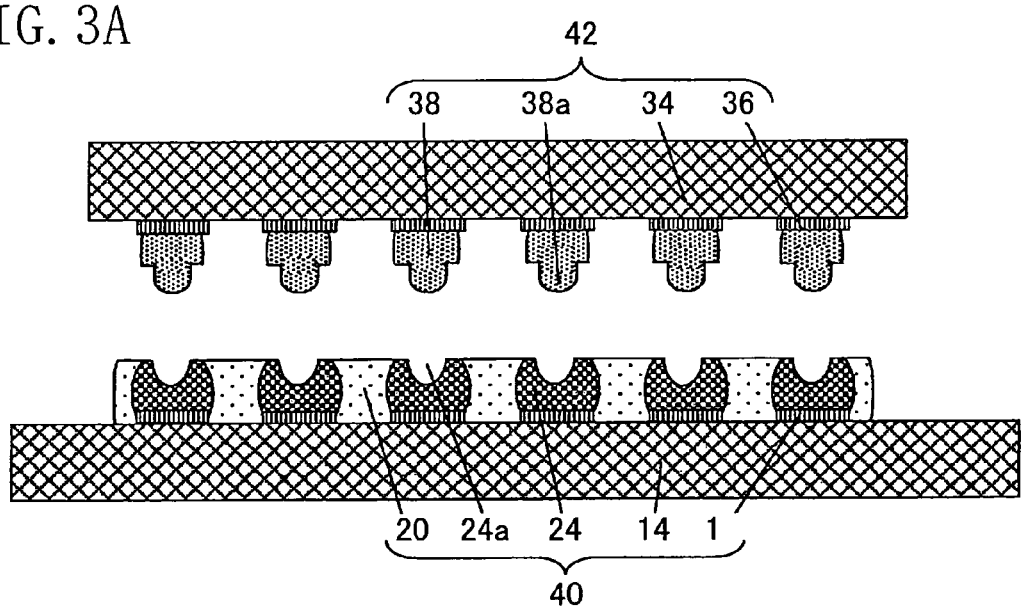
FIGS. 3A and 3B are cross-sectional views for schematically showing procedures in a method for mounting a semiconductor device according to Embodiment 3 of the invention.

FIG. 3A shows a state where a semiconductor device 34 on which solder bumps 38 each having a projection 38*a* at the center are formed and a wiring board 14 on which solder bumps 24 each having a pit 24*a* at the center are formed are aligned. At this point, the inner diameter of the pit 24*a* is slightly smaller than the outer diameter of the projection 38*a*. Furthermore, the solder bumps 38 of the semiconductor device 34 are made of a material having a higher melting point than a material used for the solder bumps 24 of the wiring board 12.

Figure 3B:
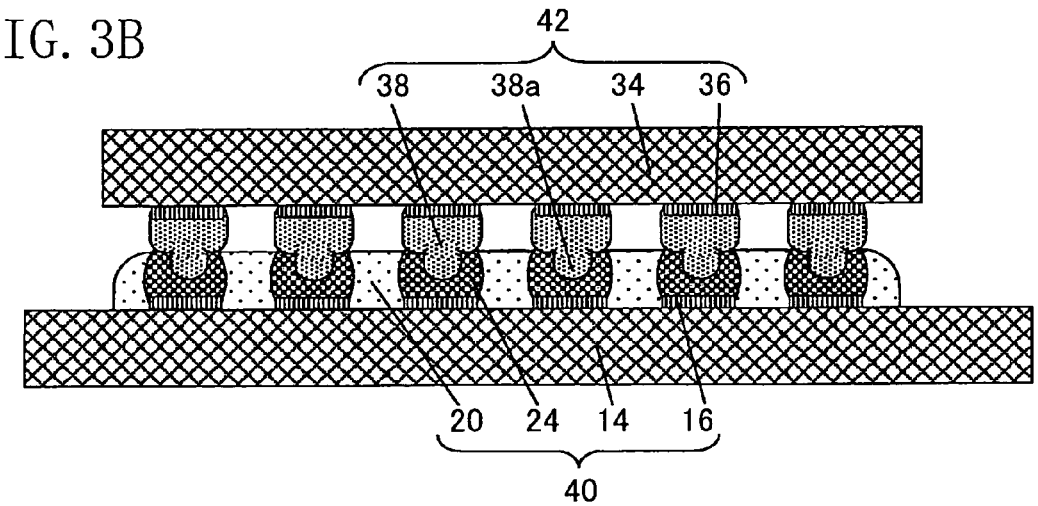

FIG. 3B shows a state where the projections 38*a* of the solder bumps 38 of the semiconductor device 34 are fit in the pits 24*a* of the solder bumps 24 of the wiring board 14. Since the solder bumps 38 of the semiconductor device 34 are made of the material having a higher melting point, they are generally harder than the solder bumps 24 of the wiring board 14. Therefore, the projections 38*a* of the solder bumps 38 push open the pits 24*a* of the solder bumps 24 to be fit therein. Although a force to push open is applied to the solder bumps 24 of the wiring board 14 in this manner, the shape of the solder bumps 24 is not spoiled because the solder bumps 24 are surrounded with a resin 20.

Furthermore, when the components are annealed at a temperature at which the solder bumps 24 of the wiring board 14 are not melted, the projections can be more smoothly fit. Through this fitting, electrical and mechanical connection is obtained.

In the aforementioned mounting method, the semiconductor device 34 can be mounted on the wiring board 14. In this method, although the connection can be obtained even at room temperature, when the components are annealed at a temperature at which the solder bumps 24 of the wiring board 14 are not melted, the connection can be obtained with smaller load.

A fitting method is employed in the connection of this embodiment, which does not limit the invention. For example, after fitting the projections 38*a* of the solder bumps 38 of the semiconductor device 34 in the pits 24*a* of the solder bumps 24 of the wiring board 14, the components may be connected to each other by annealing at a temperature at which the solder bumps with a lower melting point are melted. Alternatively, the components may be connected by annealing at a temperature at which the solder bumps with a higher melting point are melted. When they are connected through the annealing in this manner, the solders of the solder bumps are melted to be integrated, and hence, the mechanical strength can be further increased.

Furthermore, when an underfill resin is filled after such connection, the mechanical connection strength between the semiconductor device 34 and the wiring board 14 can be further increased.

Moreover, although the materials for the solder bumps 38 of the semiconductor device 34 and the solder bumps 24 of the wiring board 14 are different in this embodiment, this does not limit the invention.

Additionally, although the solder bumps 24 having the pits of the wiring board 40 and the solder bumps 38 having the projections of the semiconductor device 34 are those formed by the methods of Embodiments 1 and 2, the method of Embodiment 1 or 2 may be employed for forming the solder bumps of merely one of the wiring board and the semiconductor device. Alternatively, the pits and the projections may be replaced.

Figure 4:
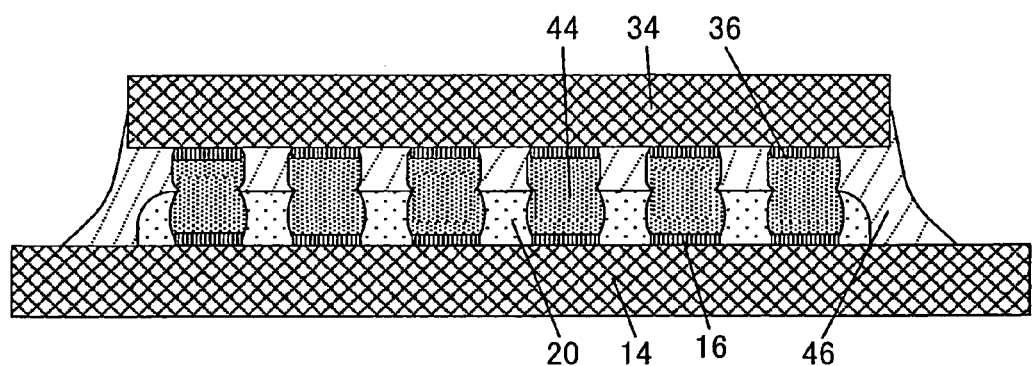
FIG. 4 is a cross-sectional view of a semiconductor device mounting structure according to a modification of the method for mounting a semiconductor device of Embodiment 3.

FIG. 4 is a cross-sectional view of a semiconductor device mounting structure according to a modification of the method for mounting a semiconductor device of this embodiment. In this mounting structure, solder bumps of a semiconductor device and solder bumps of a wiring board are made of the same solder material.

In this mounting method, after fitting the projections of the solder bumps of the semiconductor device 34 in the pits of the solder bumps of the wiring board 14, they are connected to each other by annealing them at a melting temperature of the solder. Thus, the solder bumps are melted to be formed into integrated bumps 44. In this case, the solder bumps of the wiring board 14 are surrounded with a resin 20, and the resin 20 keeps its shape at the melting temperature of the solder. Also, after forming the integrated bumps 44, an underfill resin 46 may be injected to reinforce the semiconductor device mounting structure.

In this manner, the integrated bumps 44 can be prevented from being formed in a hemispherical shape but keeps their longitudinal shape. Also, before melting, the solder bumps of the semiconductor device 34 is fit in the solder bumps of the wiring board 14, and hence their alignment is minimally shifted. As a result, the connection can be obtained with a finer pitch than in a conventional mounting method.

Figure 5:
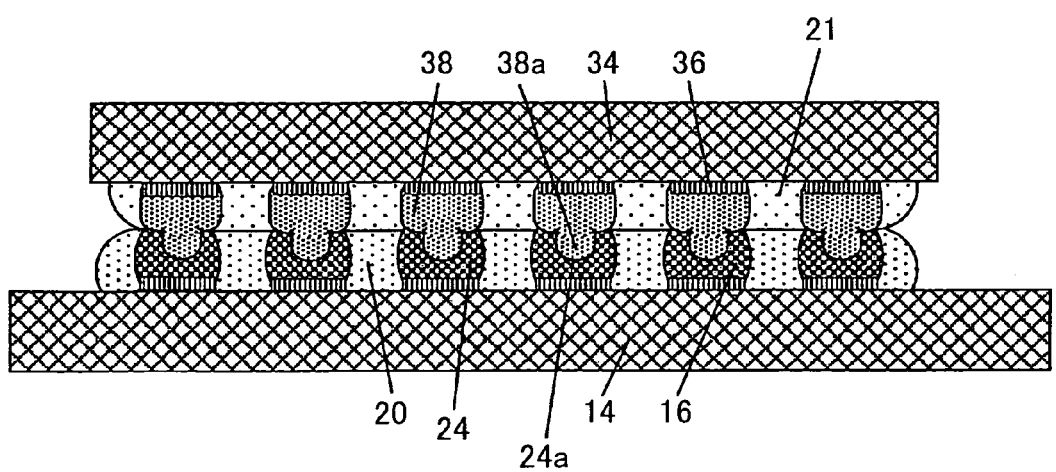
FIG. 5 is a cross-sectional view of a semiconductor device mounting structure according to another modification of the method for mounting a semiconductor device of Embodiment 3.

FIG. 5 is a cross-sectional view of a semiconductor device mounting structure according to another modification of the method for mounting a semiconductor device of this embodiment. In this mounting structure, solder bumps of a semiconductor device and solder bumps of a wiring board are made of different solder materials. Furthermore, a resin 21 remains also on the semiconductor device 34.

In this mounting method, projections 38*a* of the solder bumps 38 of the semiconductor device 34 are fit in pits 24*a* of the solder bumps 24 of the wiring board 14 for the connection. Furthermore, the whole is annealed to adhere a resin 20 of the wiring board 14 and the resin 21 of the semiconductor device 34 to each other for securing the mechanical strength. For this purpose, the resin 20 of the wiring board 14 or the resin 21 of the semiconductor device 34 is made of a thermoplastic resin or a resin in a B-stage state. Since the components are sealed in the solder mounting with these resins 20 and 21, the process can be simplified.

Although the different solder materials are used in the mounting method of this modification, the same solder material may be used for melting and integrating the solder bumps after fitting them. Also when the solder bumps are thus melted, since the solder bumps are surrounded with the resin 20 or 21, the integrated solder bumps are not formed in a hemispherical shape, and therefore, a short failure can be avoided even when the pitch is fine.

Embodiment 4

FIG. 6 shows cross-sectional views for schematically showing procedures in a method for forming solder bumps according to Embodiment 4 of the invention. In this embodiment, a case where a wiring board 54 is used as an electronic component will be described. In procedures commonly performed in Embodiment 1 or 2, this embodiment is not limited to the description below but any of various conditions, materials and the like described in Embodiment 1 or 2 may be appropriately employed.

Figure 6A:
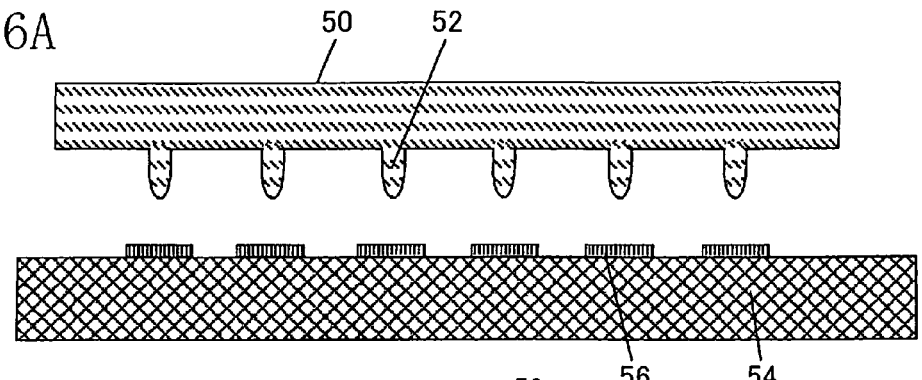
FIGS. 6A through 6E are cross-sectional views for schematically showing procedures in a method for forming solder bumps according to Embodiment 4 of the invention.

As shown in FIG. 6A, projections 52 are formed on one face of a flat plate 50 in positions corresponding to terminals 56 for forming bumps of the wiring board 54. The height of the projection 52 is substantially the same as the thickness of a resin composition 58 applied on the terminals 56.

Such projections 52 with a constant height can be formed at a given pitch, for example, by forming a given pattern on the flat plate 50 by the photolithography process and removing an unwanted portion of the flat plate by the etching or the sandblasting by using the pattern as a mask. Alternatively, they may be formed by using a resin substrate as the flat plate 50 and burying pins each in a shape of the projection 52 in the resin substrate to stand thereon. In the case where they are formed by the etching or the sandblasting, the flat plate 10 may be, for example, a glass plate, a ceramic plate, a silicon plate or the like. Alternatively, instead of burying the pins, the pins may be adhered for forming the projections 52. In this case, the flat plate is not limited to the resin substrate but may be a glass plate or the like.

Figure 6B:
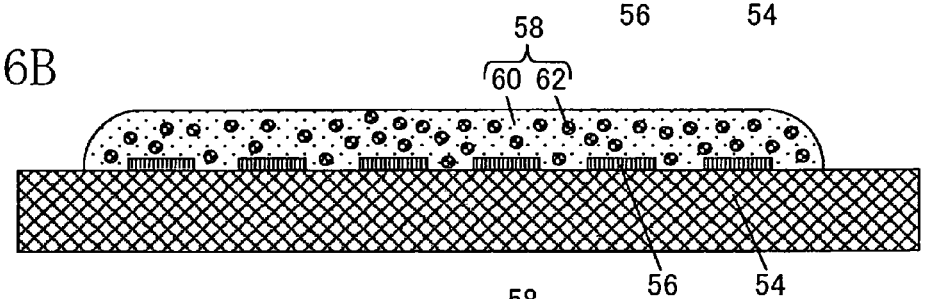
Figure 6C:
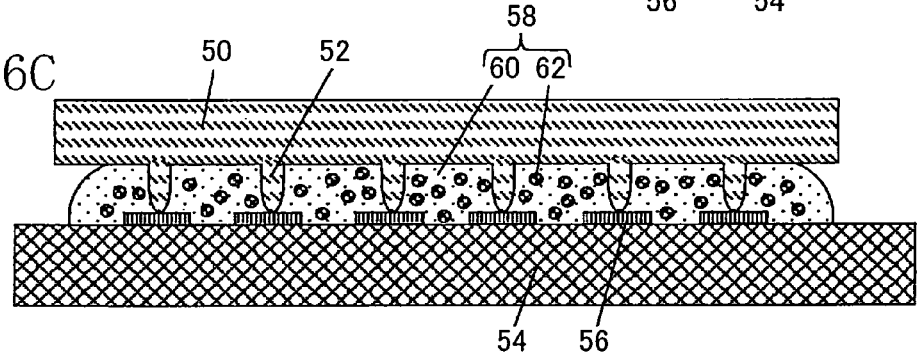
Figure 6D:
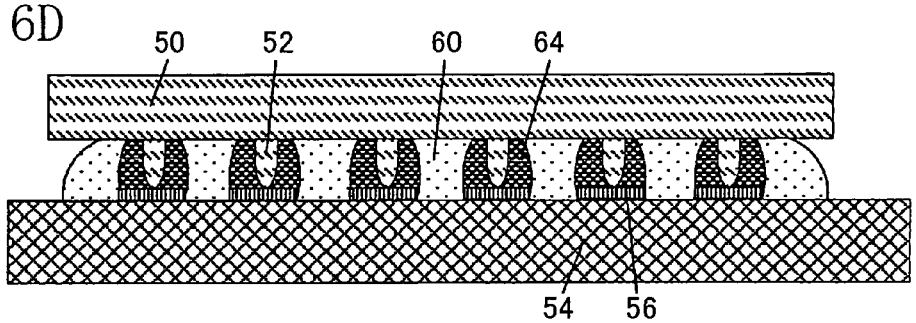
Figure 6E:
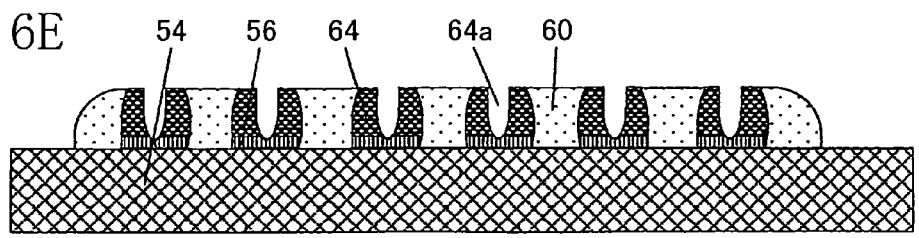
Figure 7:
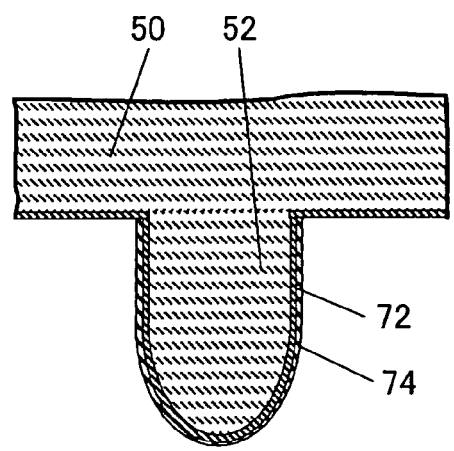
FIG. 7 is a partly enlarged cross-sectional view of a projection having a mold releasing layer and a metal film thereon used in Embodiment 4.

Furthermore, as shown in FIG. 7, a mold releasing layer 72 is formed on the projection 52, and a metal film 74 with high wettability with solder is formed on the mold releasing layer 72. FIG. 7 is a partially enlarged cross-sectional view of the mold releasing layer and the metal film with high wettability with the solder formed on the projection. As the mold releasing layer 72, a resin material with heat resistance such as fluororesin is coated. The mold releasing layer 72 may be formed on the flat plate 50 as shown in FIG. 7. Also, the metal film 74 may be formed by using, for example, solder the same as a solder powder 62 included in the resin composition 58 through vapor deposition or the like. Alternatively, a single element included in the solder powder 62 may be used. Alternatively, it may be formed by depositing or plating a metal with high wettability with the solder such as gold (Au) or silver (Ag). In the case where the vapor deposition is employed, a portion of the metal film formed on the flat plate 50 may be removed after the deposition by the photolithography process and the etching process. Furthermore, either of the mold releasing layer 72 or the metal film 74 alone may be formed. It is noted that the mold releasing layer 72 and the metal film 74 are not shown in FIG. 6.

Furthermore, the wiring board 54 may be a multi-layered board or a double-sided wiring board. A substrate of the wiring board is not particularly specified as far as it is a material resistive to the melting temperature of the solder, and may be a glass epoxy substrate, a resin substrate such as a polyimide substrate, a ceramic substrate, a glass substrate or a silicon substrate.

It is noted that conducting interconnects not shown are formed on the face of the wiring board 54 where the terminals 56 are formed. In the case where the resin composition 58 is formed on the conducting interconnects, the conducting interconnects are preferably previously covered with a resin film of a material not wettable with the solder, such as plating resist, or an inorganic insulating film. Furthermore, in order to accurately define a region of the terminal 56 where the solder is grown, a plating resist or the like is preferably formed also around the terminal 56.

Next, as shown in FIG. 6B, a given amount of the resin composition 58 is applied on a portion of the wiring board 54 where the terminals 56 are formed. Specifically, the amount is set so that when the flat plate 50 is brought into contact with the resin composition, the resin composition 58 can be spread to cover all the terminals 56 of the wiring board 54 and to fill a given gap provided between the flat plate 50 and the wiring board 54. The resin composition 58 used in this case is in the form of paste and has comparatively large viscosity. The resin composition 58 includes, as principal components, a solder powder 62, a convection additive (not shown) and a resin 60. Alternatively, the form of the resin composition 18 is not limited to the paste but may be a sheet at room temperature. Furthermore, before applying the resin composition 58, the surface of the wiring board 54, and the surface of the terminal 56 in particular, is preferably cleaned with an organic solvent, such as acetone or alcohol, or a cleaning liquid.

Next, as shown in FIG. 6C, the wiring board 54 and the flat plate 50 are aligned so that the terminals 56 of the wiring board 54 can oppose the projections 52 of the flat plate 50. Thereafter, the terminals 56 are pushed so as to allow the projections 52 of the flat plate 50 to come into contact with the terminals 56, and at the same time, the flat plate 50 is brought into contact with the resin composition 58. Through this contact, the resin composition 58 is uniformly spread between the wiring board 54 and the flat plate 50 and keeps a given thickness, and a substantially enclosed space is thus formed. Through this contact, the gap between the wiring board 54 and the flat plate 50 can be kept constant by the projections 52 of the flat plate 50. At this point, the flat plate 50 and the wiring board 54 are preferably mechanically fixed.

Next, as shown in FIG. 6D, at least the resin composition 58 is annealed at a temperature at which the solder powder 62 is melted. It is noted that the resin composition 58 may be annealed with a heater through the wiring board 54 or through the flat plate 50. Alternatively, the whole may be placed in a furnace to be wholly annealed. Alternatively, microwaves may be used for annealing merely the resin composition 58 and its vicinity.

Through this annealing, the viscosity of the resin 60 included in the resin composition 58 is lowered and its flowability is increased. Simultaneously, the convection additive is boiled or decomposed through this annealing so as to release a gas. Since the resin composition 58 including the released gas is filled within the space closed between the flat plate 50 and the wiring board 54, the gas is released to the outside through an outer circumferential gap between the flat plate 50 and the wiring board 54.

It is noted that the convection additive may not be boiled or decomposed always after the melting temperature of the solder powder 62 is attained. It may be boiled or decomposed for releasing the gas at a temperature lower than the melting temperature of the solder powder 62.

Since the gas generated within the resin composition 58 reaches the outer circumference while convecting within the resin composition 58 and then is released to the outside, the solder powder 62 also vigorously moves around within the resin composition 58 owing to the energy of the convection caused by the gas. Owing to this effect, the solder powder 62 self-assembles on the terminals 56 so as to form the bumps in a uniform shape. Furthermore, since the metal film 74 with high wettability with the solder is formed on the projections 52, the solder powder 62 self-assembles also on the projections 52. Accordingly, the solder is grown simultaneously on the terminals 56 and on the projections 52.

Thus, the solder is grown on the terminals 56 and the projections 52 ultimately up to the level of the surface of the flat plate 50 so as to surround the projections 52, resulting in forming solder bumps 64.

Next, as shown in FIG. 6E, after forming the solder bumps 64, the annealing is stopped and the solder bumps 64 are cooled to be solidified. After completing the solidification, when the flat plate 50 is removed, the solder bump 64 having a pit 64a reaching the terminal 56 at the center is formed on each terminal 56 of the wiring board 54. Since the mold releasing layer 72 is formed on the projection 52, the flat plate 50 can be easily removed between the mold releasing layer 72 and the metal film 74.

In the case where a thermoplastic resin is used as the resin 60 of the resin composition 58, the resin 60 is also solidified by stopping the annealing and cooling.

In this manner, a solder bump-formed electronic component in which the solder bumps 64 having the pits 64a reaching the terminals 56 at the center are formed on the terminals 56 of the wiring board 54, namely, a solder bump-formed wiring board, can be obtained.

These solder bumps 64 are defined in their height by the gap between the flat plate 50 and the wiring board 54, and hence, the height of the solder bumps 64 can be made very uniform. Also, since the solder is grown in a plurality of regions, namely, on the terminals 56 and on the projections 52, the diameter along the lateral direction does not largely extend but the solder bumps 64 can be formed in a large height. Also, since the solder bump 64 has the pit 64a reaching the terminal 56 at the center, for example, a semiconductor device can be mounted thereon with high yield.

Figure 8:
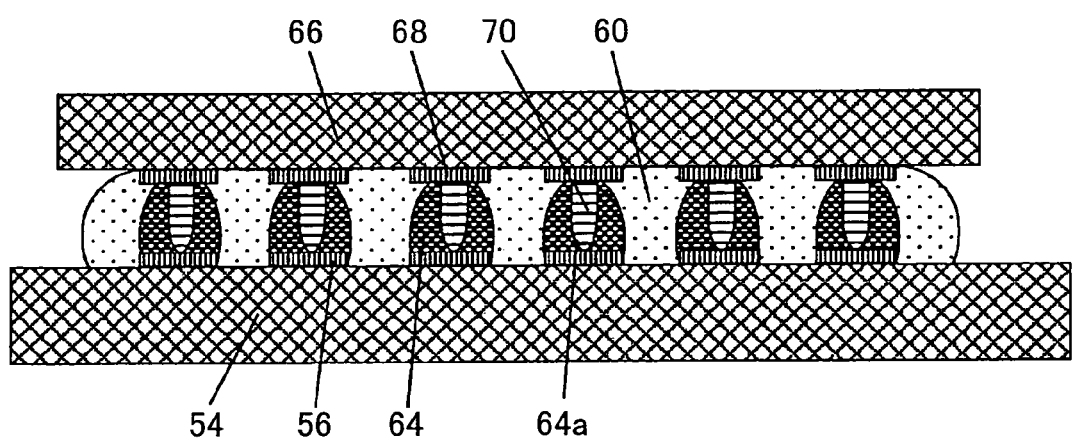
FIG. 8 is a cross-sectional view of a semiconductor device mounting structure according to Embodiment 4.

FIG. 8 is a cross-sectional view of a mounting structure in which a semiconductor device 66 is mounted on the wiring board 54 including the solder bumps 64 formed in this embodiment. The semiconductor device 66 has, on terminals 68, bumps 70 in substantially the same shape as the pits 64a of the solder bumps 64. The bumps 70 may be formed by, for example, plating with gold (Au). Alternatively, they may be formed by a stud bump method.

When the bumps 70 of the semiconductor device 66 are fit in the pits 64a of the solder bumps 64 of the wiring board 54, electric and mechanical connection can be attained. Thereafter, when the resin 60 with a thermoplastic property or in a B-stage state is annealed and pressed, the resin 60 is softened to be adhered onto the semiconductor device 66. Thus, the mounting region can be sealed.

Although solder bumps are formed on the wiring board in this embodiment, this does not limit the invention but the aforementioned solder bumps may be formed on a semiconductor device. In this case, the solder bumps can be more efficiently formed because they can be formed in a wafer state.

Although the solder bump is in a convex shape or a concave shape in this embodiment, this does not limit the invention but the solder bump can be formed in a complicated shape such as a triangle pole, a square pole, a caldera projection or a two-level projection.

Although the present invention has been described by way of preferred embodiments, the present invention is not limited to the description but can be variously modified.

It is noted that "to fit" herein means a state where a projection of a solder bump formed on one of a semiconductor device and a wiring board is inserted in a pit formed on the other of the semiconductor device and the wiring board and does not always mean a tightly fit state.

Furthermore, the "convection" herein means convection as a form of movement and can be any movement form as far as movement of a released gas within a resin composition gives kinetic energy to a solder powder dispersed in the resin composition so as to accelerate the movement of the solder powder.

INDUSTRIAL APPLICABILITY

According to the method for forming solder bumps and the method for mounting a semiconductor device of this invention, a method for forming solder bumps for realizing high density mounting as well as a highly reliable method for mounting a semiconductor device can be provided.

The invention claimed is:

1. A method for forming solder bumps on terminals of an electronic component having a plurality of terminals on an upper surface of the electronic component, comprising the steps of:

preparing a flat plate including a lower surface, the lower surface having a plurality of projections or recesses disposed thereon and a flat portion on which the plurality of projections or recesses are not disposed;

supplying a resin composition including a solder powder to the upper surface of said electronic component;

aligning the lower surface of the flat plate to oppose the upper surface of said electronic component;

bringing the lower surface of the flat plate into contact with the resin so that the flat portion and the plurality of projections or recesses make contact with the resin thereby spreading the resin composition between the upper surface and the lower surface while the flat portion does not contact the upper surface;

forming solder bumps on the terminals by melting the solder powder included in the resin composition by annealing of the resin composition and by allowing the melted solder powder to self-assemble on the terminals for growing the melted solder powder up to a level of a surface of said flat plate; and removing the flat plate after cooling and solidifying the solder bumps, wherein in the step of forming solder bumps, the solder bumps having pits corresponding to the projections or protrusions corresponding to the recesses are formed.

2. The method for forming solder bumps of claim 1, wherein said resin composition further includes a convection additive boiled or decomposed for releasing a gas when said resin composition is annealed in the step of forming solder bumps.

3. The method for forming solder bumps of claim 1,
wherein the step of supplying a resin composition comprises the steps of:
supplying said resin composition onto said electronic component; and
allowing said flat plate to come into contact with a surface of said resin composition while opposing said electronic component.

4. The method for forming solder bumps of claim 3,
wherein in the step of allowing said flat plate to come into contact with the surface of said resin composition, said flat plate is allowed to come into contact with said resin composition with said projections brought into contact with said terminals.

5. The method for forming solder bumps of claim 1,
wherein said electronic component is a wiring board or a semiconductor device.

6. The method for forming solder bumps of claim 1,
wherein a metal film having wettability with solder is formed on said projections or recesses of the flat plate.

7. The method for forming solder bumps of claim 1,
wherein a mold releasing layer having a mold releasing property with said projections or recesses is formed on said projections or recesses of the flat plate.

8. The method for forming solder bumps of claim 1, further comprising, after the step of removing said flat plate, a step of removing said resin composition.

9. The method for forming solder bumps of claim 1,
wherein in the step of forming solder bumps, said resin composition is annealed for allowing said resin composition to self-assemble on said terminals, said resin composition is further annealed to melt said solder powder included in said resin composition, and said melted solder powder is grown up to the level of the surface of said flat plate by allowing said melted solder powder to self-assemble on said terminals, whereby forming solder bumps on said terminals.

10. A method for mounting a semiconductor device on a wiring board, comprising the steps of:
forming solder bumps having pits on terminals of one of said semiconductor device and said wiring board;
forming solder bumps having protrusions on terminals of the other one of said semiconductor device and said wiring board; and
mutually fitting and connecting said solder bumps formed on said terminals of said semiconductor device and said solder bumps formed on said terminals of said wiring board,
wherein at least said solder bumps having pits or said solder bumps having protrusions are formed by the method for forming solder bumps of claim 1, 11. The method for mounting a semiconductor device of claim 10,
wherein the step of mutually fitting and connecting said solder bumps includes a step of annealing for melting at least either of said solder bumps of said semiconductor device or said solder bumps of said wiring board mutually fit.

12. The method for mounting a semiconductor device of claim 11,
wherein said solder bumps of said semiconductor device are made of a different solder material from said solder bumps of said wiring board.

* * * * *

UNITED STATES PATENT AND TRADEMARK OFFICE
CERTIFICATE OF CORRECTION

PATENT NO.         : 7,611,040 B2
APPLICATION NO.    : 11/579505
DATED              : November 3, 2009
INVENTOR(S)        : Takashi Kitae et al.

It is certified that error appears in the above-identified patent and that said Letters Patent is hereby corrected as shown below:

Title page, under (56) References Cited, Other Publications, should read:

Masahiro RITO et al. "Assembly Process by Electrically Conductive Adhesive Using Low Melting Point Fillers" 9th Symposium on "Microjoining and Assembly Technology in Electronics", February 6-7, 2003, Yokohama, pp. 115-120.

Masahiro YASUDA et al., "Self-Organized Joining Assembly Process by Electrically Conductive Adhesive Using Low Melting Point Fillers", 10th Symposium on "Microjoining and Assembly Technology in Electronics", February 5-6, 2004, Yokohama, pp. 183-188.

Title page 2, Kiyokazu YASUDA et al., "Self-Organized Packaging using Polymer Containing Low-Melting-Point-Metal filler-Process Simulation of Viscous Multi Phase Flow Fluid-" 11th Symposium on "Microjoining and Assembly Technology in Electronics", February 3-4, 2005, Yokohama, pp. 239-244.

Title page 2, Takayuki YAMADA et al., "Self-Organized Packaging by Polymer Containing Low Melting Point Metal-Experimental Verification of Process Rule Factors of Self-organization-" 11th Symposium on "Microjoining and Assembly Technology in Electronics", February 3-4, 2005, Yokohama, pp. 245-250.

Signed and Sealed this
Fifth Day of April, 2011

David J. Kappos
*Director of the United States Patent and Trademark Office*